United States Patent
Schutt et al.

(10) Patent No.: US 12,405,391 B2
(45) Date of Patent: Sep. 2, 2025

(54) PEROVSKITE-CONTAINING SCINTILLATORS AND METHODS OF MAKING THE SAME

(71) Applicant: Alliance for Sustainable Energy, LLC, Golden, CO (US)

(72) Inventors: Kelly Robert Schutt, Lakewood, CO (US); Joseph Jonathan Berry, Boulder, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 180 days.

(21) Appl. No.: 18/004,936

(22) PCT Filed: Jul. 12, 2021

(86) PCT No.: PCT/US2021/041267
§ 371 (c)(1),
(2) Date: Jan. 10, 2023

(87) PCT Pub. No.: WO2022/011335
PCT Pub. Date: Jan. 13, 2022

(65) Prior Publication Data
US 2023/0350083 A1  Nov. 2, 2023

Related U.S. Application Data

(60) Provisional application No. 63/050,175, filed on Jul. 10, 2020.

(51) Int. Cl.
C09K 11/06 (2006.01)
C09K 11/66 (2006.01)
(Continued)

(52) U.S. Cl.
CPC ............ *G01T 1/2018* (2013.01); *C09K 11/06* (2013.01); *C09K 11/665* (2013.01); *H10F 39/1898* (2025.01); *C09K 2211/10* (2013.01)

(58) Field of Classification Search
CPC ..... G01T 1/2018; C09K 11/06; C09K 11/665; C09K 2211/10; H01L 27/14663
See application file for complete search history.

(56) References Cited

U.S. PATENT DOCUMENTS 6,519,313 B2   2/2003  Venkataramani et al.
7,308,074 B2  12/2007  Jiang et al.
(Continued)

FOREIGN PATENT DOCUMENTS

CN    110416347 A1   11/2019
CN    117100295 A  * 11/2023  ............. C09K 11/00
(Continued)

OTHER PUBLICATIONS

Chen, Q. et al., "All-inorganic perovskite nanocrystal scintillators," Nature, vol. 561, Sep. 6, 2018, 22 pages.
(Continued)

*Primary Examiner* — David P Porta
*Assistant Examiner* — Fani Polyzos Boosalis
(74) *Attorney, Agent, or Firm* — Michael A. McIntyre

(57) ABSTRACT

An aspect of the present disclosure is a method of making a device, wherein the method includes, in order, depositing a layer of a photoresist onto a substrate, depositing a mask onto the photoresist, developing the photoresist, resulting in the forming of a grid having a plurality of cavities, and depositing a semiconductor onto the grid, resulting in substantially filling each cavity with the semiconductor.

20 Claims, 15 Drawing Sheets

(51) Int. Cl.
G01T 1/20 (2006.01)
H10F 39/18 (2025.01)

(56) References Cited

U.S. PATENT DOCUMENTS

| | | | |
|---|---|---|---|
| 8,981,306 B2 | 3/2015 | Murphy et al. | |
| 9,983,319 B2 | 5/2018 | Fischer et al. | |
| 10,151,858 B2* | 12/2018 | Soci | G02B 1/002 |
| 11,971,616 B1* | 4/2024 | Wyatt | H01L 25/0753 |
| 12,089,424 B2* | 9/2024 | Guo | H10K 39/32 |
| 2005/0104000 A1 | 5/2005 | Kindem et al. | |
| 2006/0027759 A1 | 2/2006 | Jiang et al. | |
| 2012/0223214 A1 | 9/2012 | Lee et al. | |
| 2017/0160405 A1 | 6/2017 | Kim et al. | |
| 2020/0255724 A1 | 8/2020 | Mohammed et al. | |
| 2021/0171828 A1 | 6/2021 | Liu et al. | |

FOREIGN PATENT DOCUMENTS

| | | | | |
|---|---|---|---|---|
| CN | 118265420 A * | 6/2024 | | H10K 50/12 |
| DE | 102014225543 B4 * | 2/2021 | | H10K 85/50 |
| WO | 2019203737 A1 | 10/2019 | | |
| WO | WO-2021017717 A1 * | 2/2021 | | H10F 30/301 |

OTHER PUBLICATIONS

Cooper, K.A. et al., "Conformal Photoresist Coatings for High Aspect Ratio Features," Proc. IWLPC, Sep. 2007, 6 pages.

Gandini, M. et al., "Efficient, fast and reabsorption-free perovskite nanocrystal-based sensitized plastic scintillators," Nature Nanotechnology, https://doi.org/10.1038/s41565-020-0638-8, 9 pages, Mar. 2020.

Hamamatsu Handbook on X-ray detectors, Chapter 09, 21 pages, Oct. 2003.

Heon, J.H. et al., "High-Performance Next-Generation Perovskite Nanocrystal Scintillator for Nondestructive X-Ray Imaging," Advanced Materials, vol. 30, 2018, 6 pages.

Kim, J.K. et al., "Omni-directional reflectors for light-emitting diodes," Proceedings of SPIE, Integrated Optoelectronic Devices 2006, San Jose, California, 13 pages.

Qdot, "Perovskite ABX3 Quantum Dots for QD LEDs," handout, 1 page, 2021.

Ramirez, D. et al., "Layered Mixed Tin-Lead Hybrid Perovskite Solar Cells With High Stability," ACS Energy Letters, vol. 3, 2018, 6 pages.

Talukdar, T. K. et al., "Superconformal coating and filling of deep trenches by chemical vapor deposition with forward-directed fluxes," J. Vac. Sci. Technol. A, vol. 36, No. 5, Sep./Oct. 2018, 11 pages.

Villien, M. and Mouly, J., "X-ray detectors for medical, industrial and security applications," Yole Developpement, 2019, 43 pages.

Webb, L., "Purchasing Insight: Portable X-ray," https://www.healthcarefinancenews.com/blog/purchasing-insight-portable-x-ray, Jul. 9, 2014, 9 pages.

Wei, H. et al., "Halide lead perovskites for ionizing radiation detection," Nature Communications, vol. 10, 2019, 12 pages.

Zhang, Y. et al., Metal Halide Perovskite Nanosheet for X-ray High-Resolution Scintillation Imaging Screens, ACS Nano, vol. 13, 2019, 6 pages.

Zhao, J. et al., "Is Cu a stable electrode material in hybrid perovskite solar cells for a 30-year lifetime?", RSC Energy & Environmental Science, vol. 9, 2016, 7 pages.

Kim, Y.C. et al., "Printable organometallic perovskite enables large-area, low-dose X-ray imaging," Nature Letter, vol. 550, Oct. 5, 2017, 10 pages.

Search Report and Written Opinion from corresponding PCT patent application No. PCT/US21/41267 dated Jan. 18, 2022, 10 pages.

* cited by examiner

A
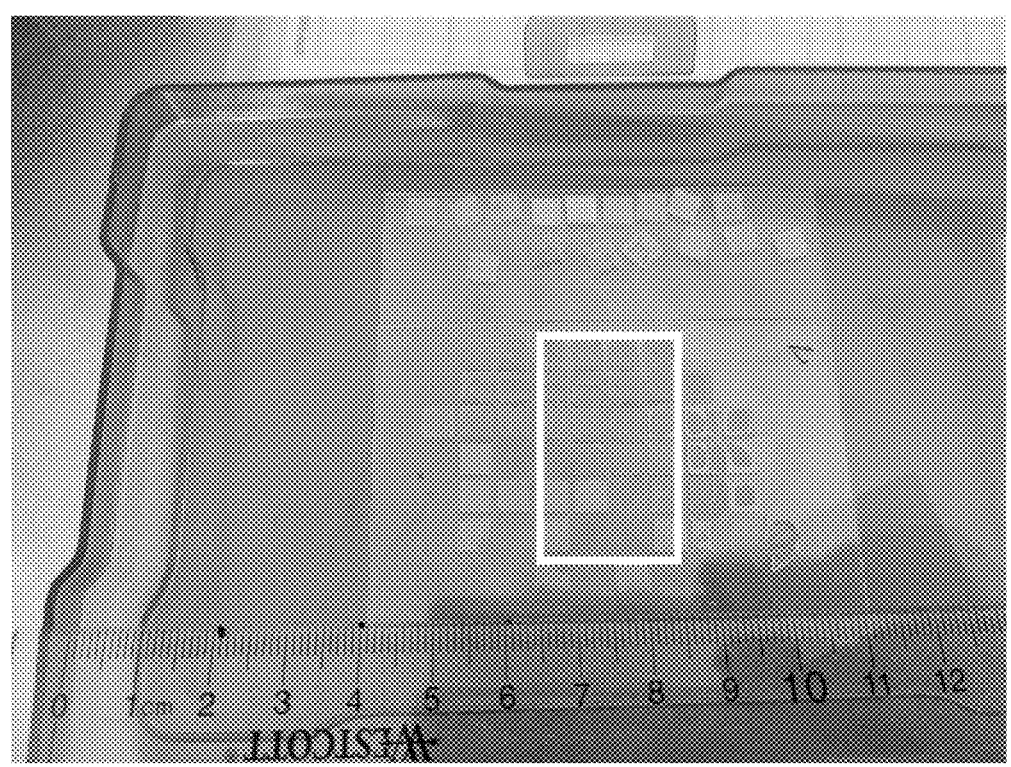
B
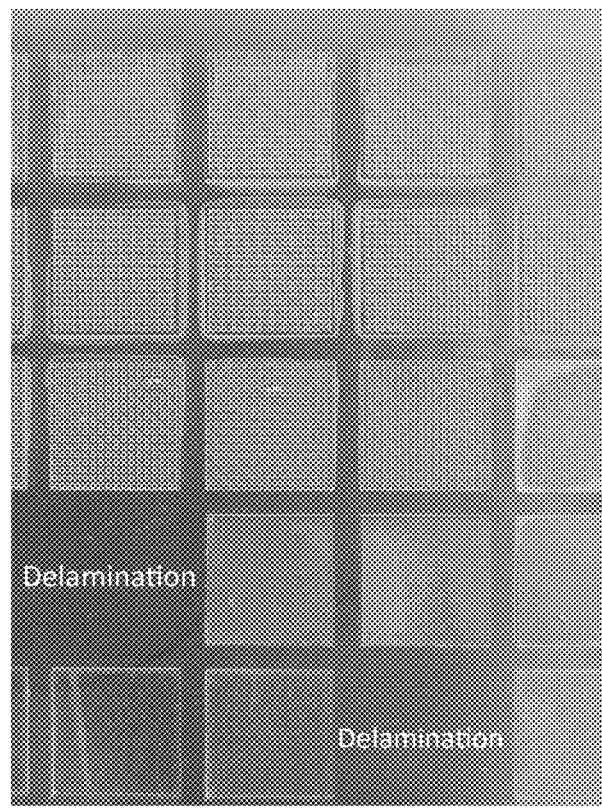
Figure 5

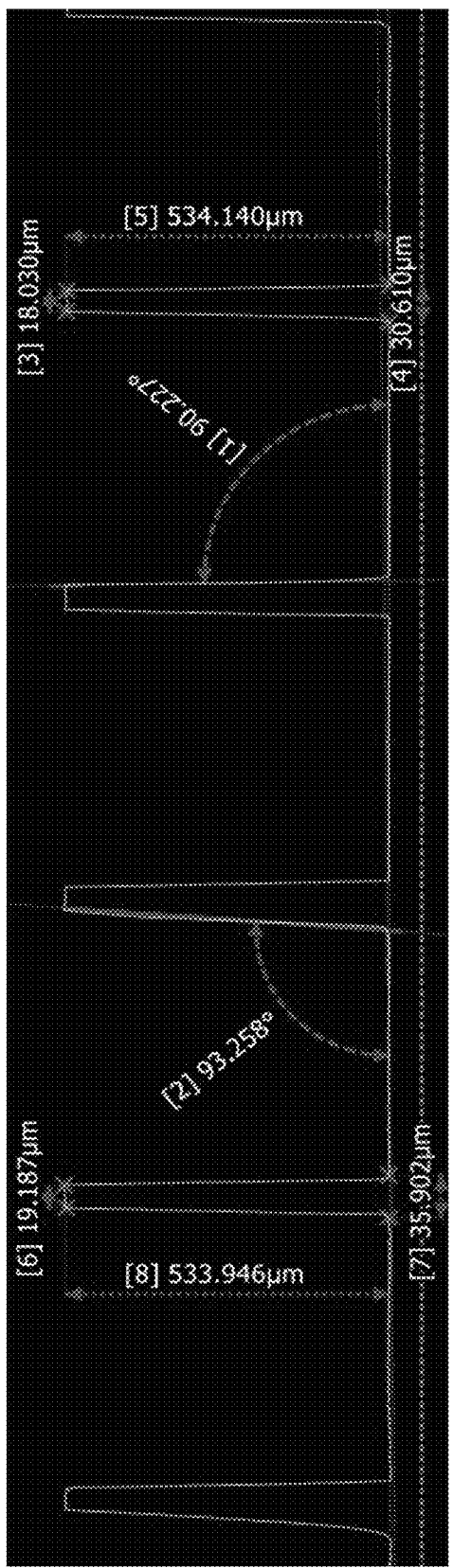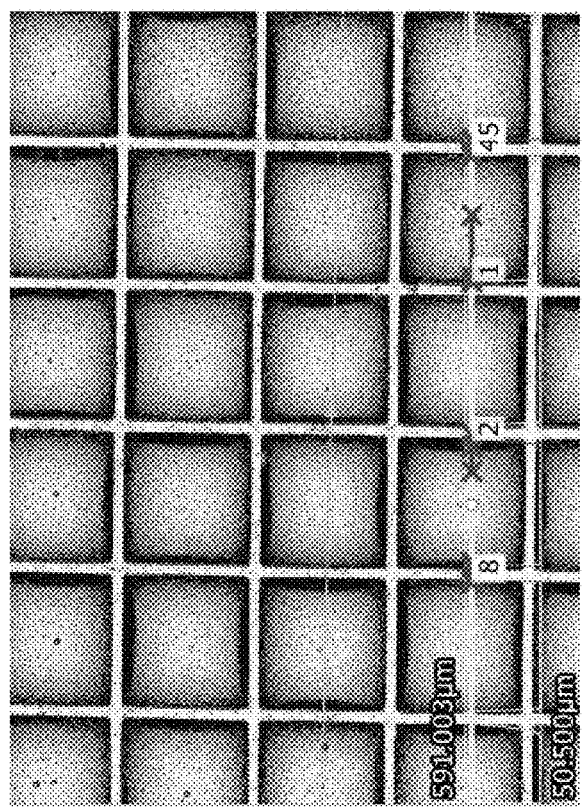
Figure 7

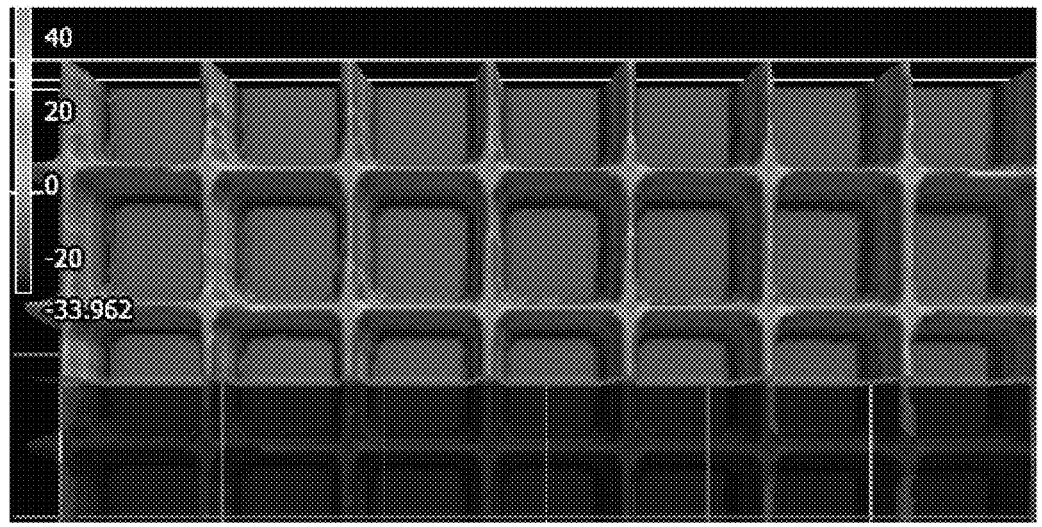
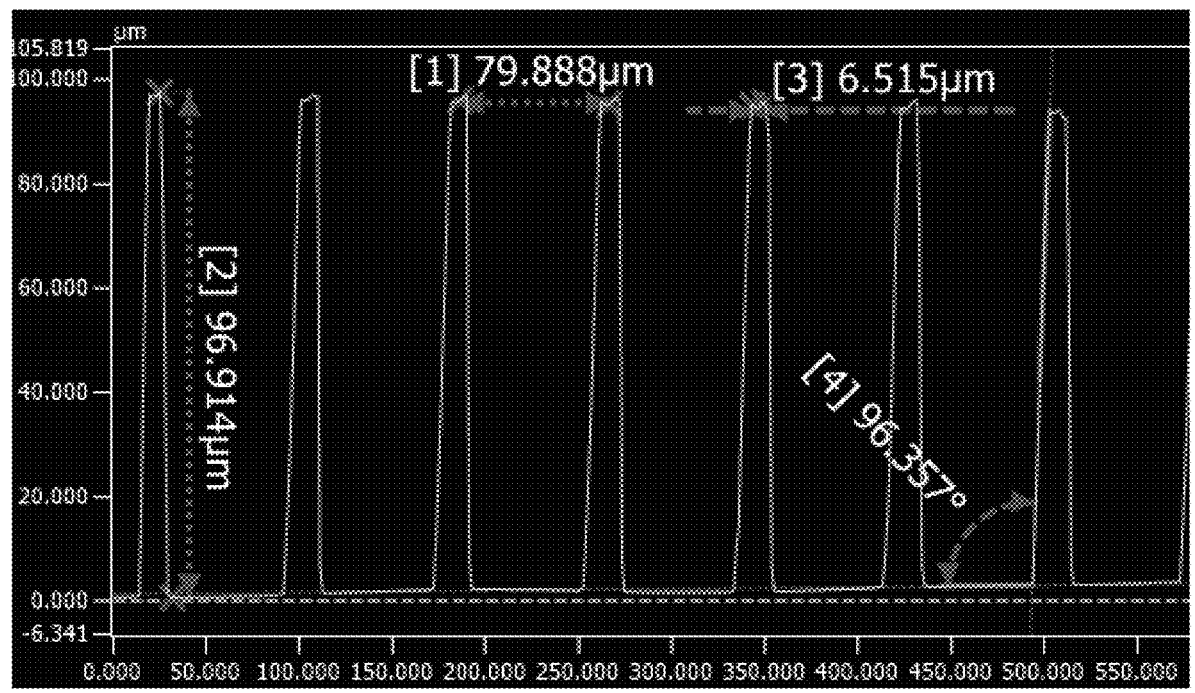

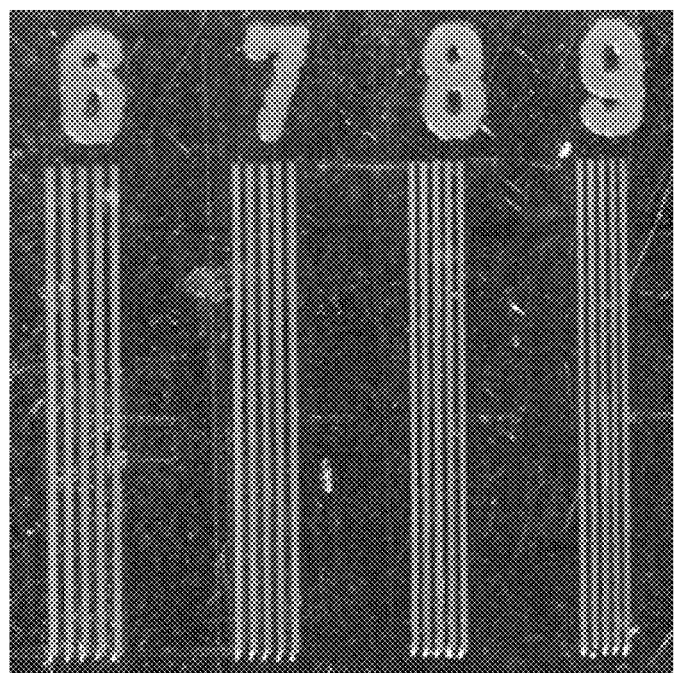
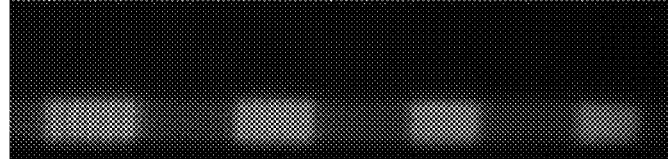
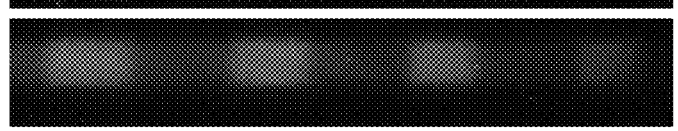
Test Pattern
Patterned Detector
Unpatterned Detector
Figure 15

PEROVSKITE-CONTAINING SCINTILLATORS AND METHODS OF MAKING THE SAME

CROSS-REFERENCE TO RELATED APPLICATIONS

This application claims priority from U.S. Provisional Patent Application No. 63/050,175 filed on Jul. 10, 2020, the contents of which are incorporated herein by reference in their entirety.

CONTRACTUAL ORIGIN

This invention was made with government support under Contract No. DE-AC36-08GO28308 awarded by the Department of Energy. The government has certain rights in the invention.

BACKGROUND

Scintillators are materials that convert ionizing radiation to visible light to capture an image on photographic films or digital devices. Scintillators are commonly used in x-ray and gamma ray medical imaging, security applications, and industrial quality control. Current state-of-the-art scintillators are wide band gap materials such as CsI (5.3 eV), $Gd_2O_2S$ (4.6-4.8 eV), and $Bi_4Ge_3O_{12}$ (4.2 eV) that are doped with impurities that create states within the band gap. These impurity states enable energy transfer from the wider band gap matrix material, resulting in photoluminescence in the visible spectrum. The low concentration of impurities limits reabsorption-related losses in these materials since the matrix is translucent, allowing visible light propagation over distances that exceed one hundred microns in commercial detectors. However, the current technologies fail to fit two market needs for lower cost and, in a medical setting, lower dose radiation for patient safety. Thus, there remains a need for improved scintillators and semiconducting materials for producing scintillators, as well as methods for producing such compositions and devices.

SUMMARY

An aspect of the present disclosure is a device that includes a substrate, a grid having a plurality of cavities, and a semiconductor substantially filling each cavity, where each cavity is positioned on the substrate, each cavity is defined by at least three sidewalls positioned substantially perpendicular to the substrate, the semiconductor is configured to absorb an incoming light, the semiconductor is configured to emit a light as a result of absorbing the incoming light, each cavity is configured to direct at least a portion of the emitted light to the substrate, and the substrate is substantially transparent to the emitted light.

In some embodiment of the present disclosure, the device may further include a photodiode, where the substrate is positioned between the grid and the photodiode, and the photodiode is configured to absorb the emitted light and convert the absorbed emitted light to an electrical signal.

In some embodiment of the present disclosure, the device may further include a complementary metal oxide semiconductor (CMOS) chip and/or a thin film transistor (TFT) array, where the photodiode is positioned beneath the substrate and within the CMOS chip or TFT array.

In some embodiment of the present disclosure, a surface of each sidewall may be substantially covered by a side reflector, where the surface is substantially perpendicular to the substrate, and the side reflector is configured to direct the emitted light to the substrate.

In some embodiment of the present disclosure, the device may further include a top reflector positioned adjacent to the plurality of cavities, where the plurality of cavities is positioned between the top reflector and the substrate.

In some embodiment of the present disclosure, the device may further include an encapsulating layer positioned adjacent to the top reflector, where the top reflector is positioned between the encapsulating layer and the plurality of cavities.

In some embodiment of the present disclosure, the incoming light may include x-rays.

In some embodiment of the present disclosure, the emitted light may have a wavelength between about 400 nm and about 550 nm.

In some embodiment of the present disclosure, the semiconductor may include at least one of a perovskite, CdSe, $Cs_3Cu_2I_5$, and/or PbS.

In some embodiment of the present disclosure, the perovskite may include at least one of $FA_{1-x}Cs_xPbBr_3$ and/or $CsPbI_{3-y}Br_y$.

In some embodiment of the present disclosure, each cavity may have a depth between about 50 μm and about 5 mm.

In some embodiment of the present disclosure, the depth may be between about 250 μm and about 1 mm.

In some embodiment of the present disclosure, the top reflector may be constructed of at least one of beryllium, aluminum, and/or amorphous carbon.

In some embodiment of the present disclosure, the top reflector may have a thickness between about greater than zero μm and about 500 μm.

An aspect of the present disclosure is a method of making a device, wherein the method includes, in order, depositing a layer of a photoresist onto a substrate, depositing a mask onto the photoresist, developing the photoresist, resulting in the forming of a grid having a plurality of cavities, and depositing a semiconductor onto the grid, resulting in substantially filling each cavity with the semiconductor.

BRIEF DESCRIPTION OF THE DRAWINGS

Some embodiments of the present disclosure are illustrated in the referenced figures of the drawings. It is intended that the embodiments and figures disclosed herein are to be considered illustrative rather than limiting.

FIG. 5 illustrates grids of cavities developed on a glass substrate using the photomask in illustrated in FIG. 4, according to some embodiments of the present disclosure.

FIG. 7 illustrates a cross-sectional line profile for a grid having 250 μm pitch cavities, according to some embodiments of the present disclosure.

FIG. 13 illustrates a cross-sectional line profile for a grid of cavities having 75 µm widths, according to some embodiments of the present disclosure.

FIG. 15 illustrates an X-ray resolution test pattern (Panel A) and images resulting from patterned and unpatterned scintillator devices exposed to the X-ray pattern (Panel B), according to some embodiments of the present disclosure.

REFERENCE NUMERALS

Figure 1:
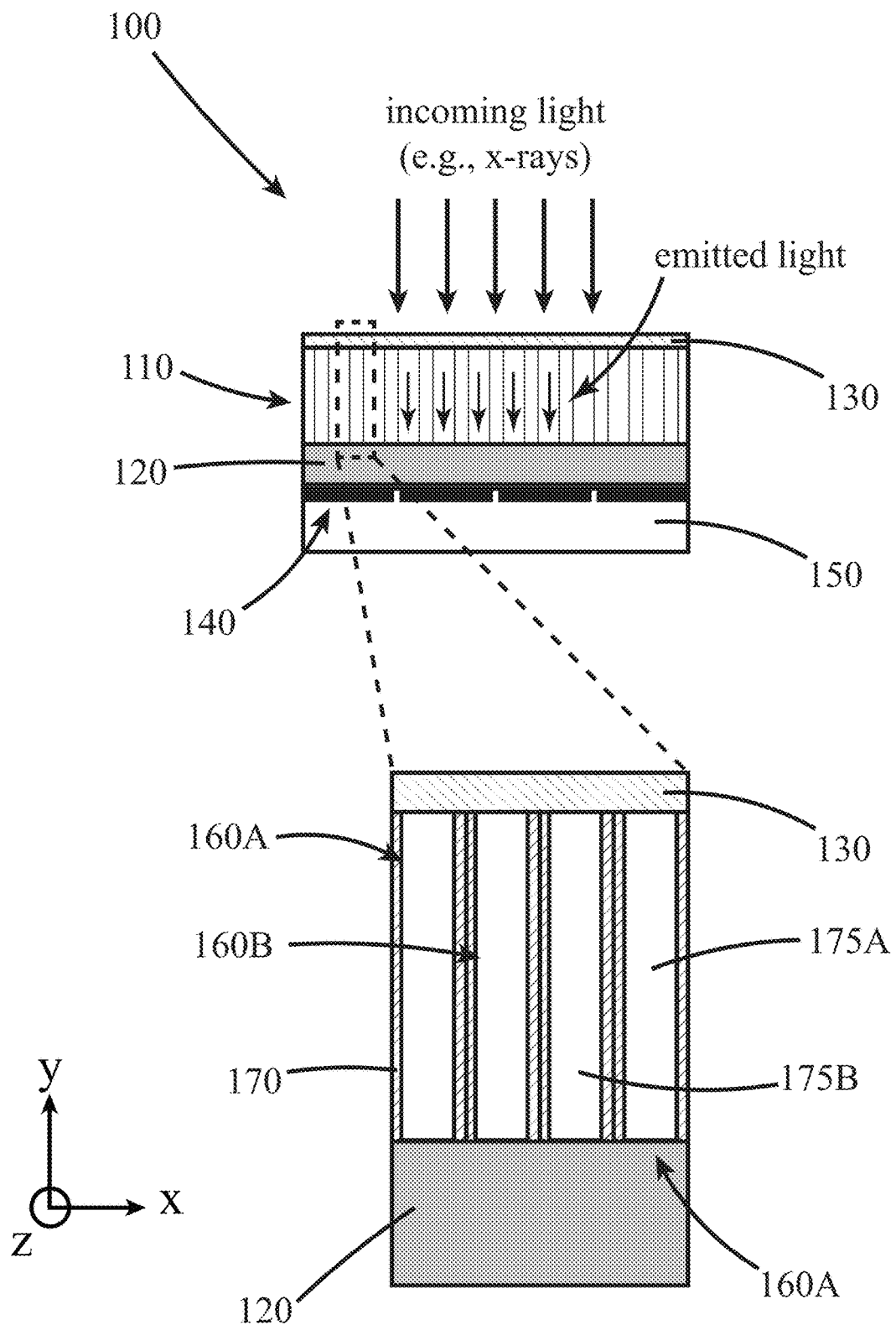
FIG. 1 illustrates a scintillator device, according to some embodiments of the present disclosure.

100 . . . device (i.e., scintillator)
110 . . . semiconductor layer
120 . . . substrate
130 . . . top reflector
140 . . . photodiode
150 . . . complementary metal oxide semiconductor (CMOS) chip
160 . . . cavity
170 . . . side reflector
175 . . . semiconductor
180 . . . grid
185 . . . sidewall
190 . . . opening
300 . . . method
305 . . . providing substrate
310 . . . first depositing of photoresist
315 . . . second depositing of mask
320 . . . developing photoresist
325 . . . third depositing of side reflector
330 . . . fourth depositing of semiconductor
335 . . . fifth depositing of top reflector
340 . . . sixth depositing of encapsulating layer
350 . . . photoresist
355 . . . mask
360 . . . encapsulating layer

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to scintillators having, among other things, high luminescence efficiency (high light output/signal), high radiation hardness (durability), and a high effective atomic number (strong x-ray absorption/stopping power). The present disclosure also relates to methods for manufacturing such scintillators. In particular, the present disclosure relates to scintillator devices constructed of a plurality of cavities in a grid like pattern, the walls of which are constructed of a light-sensitive organic material that undergoes a change in solubility of a chemical developer during exposure to light. The solubility change results from photocrosslinking or photopolymerization (negative resists) or photodecomposition (positive resists).

FIG. 1 illustrates a simplified drawing of a scintillator device 100, according to some embodiments of the present disclosure. In general, a scintillator device 100 operates as follows. x-rays from a source are directed to and are attenuated as they pass through a patient and strike the outer surface of a scintillator device and pass into a semiconductor layer where a portion is absorbed, resulting in light being emitted by the semiconductor layer. The emitted light then passes through an underlying transparent substrate to impinge upon thin film transistor photodiodes positioned within a complementary metal oxide semiconductor (CMOS) chip. The CMOS chip is configured to convert the emitted light received by the photodiodes to an electrical signal which can then, for example, be transmitted to a display to visualize an image representing the patient originally exposed to the x-rays.

Referring again to FIG. 1, the top representation of a scintillator device 100 having a semiconductor layer 110 configured to receive incoming light (e.g., x-rays). The incoming light passes into the semiconductor layer 110, which absorbs at least a portion of the incoming light and then emits at least a portion of the energy absorbed as emitted light. The emitted light is directed by a "waveguides", which are explained in more detail below, away from the source of the incoming light towards one or more photodiodes 140 (four photodiodes shown), which absorb the incoming light and converts the light signal to an electrical signal that can be converted again to an image on a display (not shown).

As shown in the top portion of FIG. 1, a scintillator device 100 may be configured with the semiconductor layer 110 positioned between a top reflector 130 and a substrate 120, with the substrate 120 positioned between the semiconductor layer 110 and the photodiode(s) 140. In addition, the photodiode(s) 140 may be positioned on and/or within a CMOS chip. A photodiode array can utilize either CMOS or thin film transistor (TFT) technology. In both cases, photons emitted by the semiconductor layer 110 are absorbed by the photodiode(s) 140, which converts the photons into electrical charge. The collected charge is proportional to the incident x-ray energy, which corresponds to attenuation in the region of the subject being imaged. The quantity of stored charge is collected during a readout operation and determines the brightness of a pixel in the final image.

The lower portion of FIG. 1 is a magnification of the section enclosed by the dashed box of the scintillator device 100 shown in the upper portion of FIG. 1. The magnification shows that, in some embodiments of the present disclosure, the semiconductor layer 110 may include a plurality of cavities 160 positioned between a top reflector 130 and a substrate 120. Each cavity 160 is a volume defined by the inside surfaces of each of the top reflector 130, the substrate, and vertical sidewalls. Each cavity 160 may be configured with one or more side reflectors 170, e.g., one for each vertical side of each cavity. In some embodiments of the present disclosure, each cavity 160 may have a square cross-sectional shape in the xz-plane, defined by four perpendicular walls (in the z-direction). The cavity 160, which is essentially empty at various stages of its manufacture, is ultimately filled, or at least substantially filled, with the semiconductor 175. The magnified view of scintillator 100 illustrates four cavities 160, but for simplicity only two are called out: 160A and 160B. Similarly, each cavity 160 is filled with semiconductor 175, however, only two of the semiconductor portions isolated in their individual cavities are called out: 175A and 175B.

Figure 2:
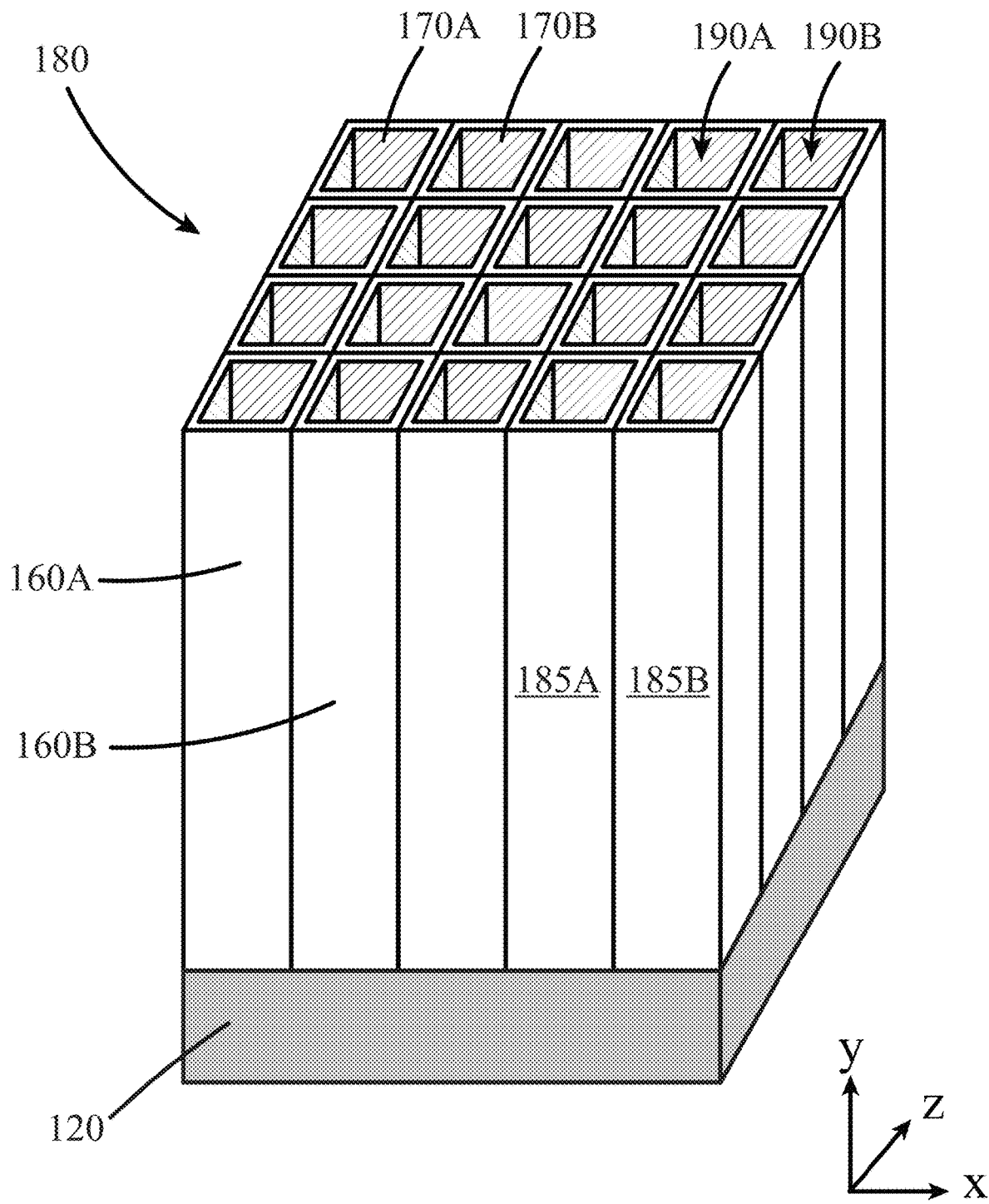
FIG. 2 illustrates a scintillator device, according to some embodiments of the present disclosure.

FIG. 2 illustrates a different view of a scintillator device 100. In this exemplary device 100, four rows of five cavities 160 are illustrated (only two called out—160A and 160B). Each cavity 160 is configured to have a substantially square cross-sectional shape in the xy-plane. Each cavity 160 is shown empty (i.e., not filled with a semiconductor), with only the side reflectors 165 showing (only two called out—170A and 170B). The ends of each side wall 185 closest to the light source, e.g., x-rays, terminate to form an opening 190 (two called out—190A and 190B). During manufacture of the device, these openings 190 allow the cavities 160 to be filled with semiconductor 175 after which the top reflector 130 may be deposited. The sidewalls 185 of the cavities 185 are constructed of the photoresist material; i.e. a light-sensitive organic material that undergoes either photopolymerization or photodecomposition when exposed to light. Examples of off-the-shelf photoresist materials include SUEX®, DJ Microlaminates, THB-151N, and/or SU-8.

Referring again to FIG. 1, a semiconductor layer 110 may be constructed of at least one of a perovskite, CdSe, $Cs_3Cu_2I_5$, and/or PbS. Examples of suitable perovskites include at least one of $FA_{1-x}Cs_xPbBr_3$ and/or $CsPbI_{3-y}Br_y$. In some embodiments of the present disclosure, a semiconductor layer 110 may have a thickness between about 50 μm and about 5 mm, or between about 250 μm and about 1 mm. In some embodiments of the present disclosure, a semiconductor layer 110 may emit light having a wavelength between about 400 nm and about 550 nm. In some embodiments of the present disclosure, a top reflector 110 is configured to allow the incoming light to enter the device 100 but minimize the amount of either incoming light and/or emitted light from exiting the device 100. Thus, the top reflector 110 must be substantially transparent to the incoming light. In some embodiments of the present disclosure a top reflector 110 may be provided constructed of at least one of beryllium having a thickness between about 25 μm and about 500 μm, aluminum have a thickness between greater than 0 μm and about 25 μm, and/or amorphous carbon. As shown in FIGS. 1 and 2, a semiconductor layer 110 may be constructed on a substrate 120. This substrate 120 needs to be substantially transparent to the emitted light and, in some embodiments of the present disclosure, may be a fiber optic plate constructed of a plurality of glass optical fiber, with each fiber having a diameter on the order of about one μm.

Referring again to the lower portion of FIG. 1 and FIG. 2, each cavity 160 may be defined by at three or more sidewalls 185 having a characteristic height (H) (i.e., depth) in the z-direction and a characteristic width (W) in the xz-plane, where the width (W) includes the thickness of the side walls. The sidewalls 185 define a cross-sectional shape in the xz-plane, which may be at least one of a triangle, square, rectangle, and/or any other suitable polygon. Each sidewall 185 has a thickness in the xz-plane, as does each side reflector 170. In some embodiments of the present disclosure, a side reflector 170 may be constructed using at least one of gold, silver, aluminum, copper, $SiO_2$, $TiO_2$, and/or $SnO_2$ having a thickness between about 50 nm and about 250 nm. In some embodiments of the present disclosure, a side reflector 170, one or more layers, may be deposited by atomic layer deposition or through solution-processing techniques such as the growth of self-assembled monolayers of $SiO_2$ by threating the sidewalls 185 with one or more silanes. In some embodiments of the present disclosure, a side reflector 170 may be constructed of one or more layers. A sidewall 185 of a cavity 160 may have a thickness between about 1 μm and about 500 μm, or between about 1 μm and about 50 μm. The pitch of a sidewall 185 may be between about greater than zero μm and about 250 μm. The height (H) of a cavity 160 (and its sidewalls 185) may be between about 50 μm and about 2 mm. The width (W) of a cavity 160 may be between about 1 μm and about 250 μm, or between about 1 μm and about 10 μm. In some embodiments of the present disclosure, a grid 180 may have millions of cavities for a flat panel size of about 40 cm by 30 cm (e.g., a 25 μm pitch at this dimension results in 192 million cavities).

Figure 3:
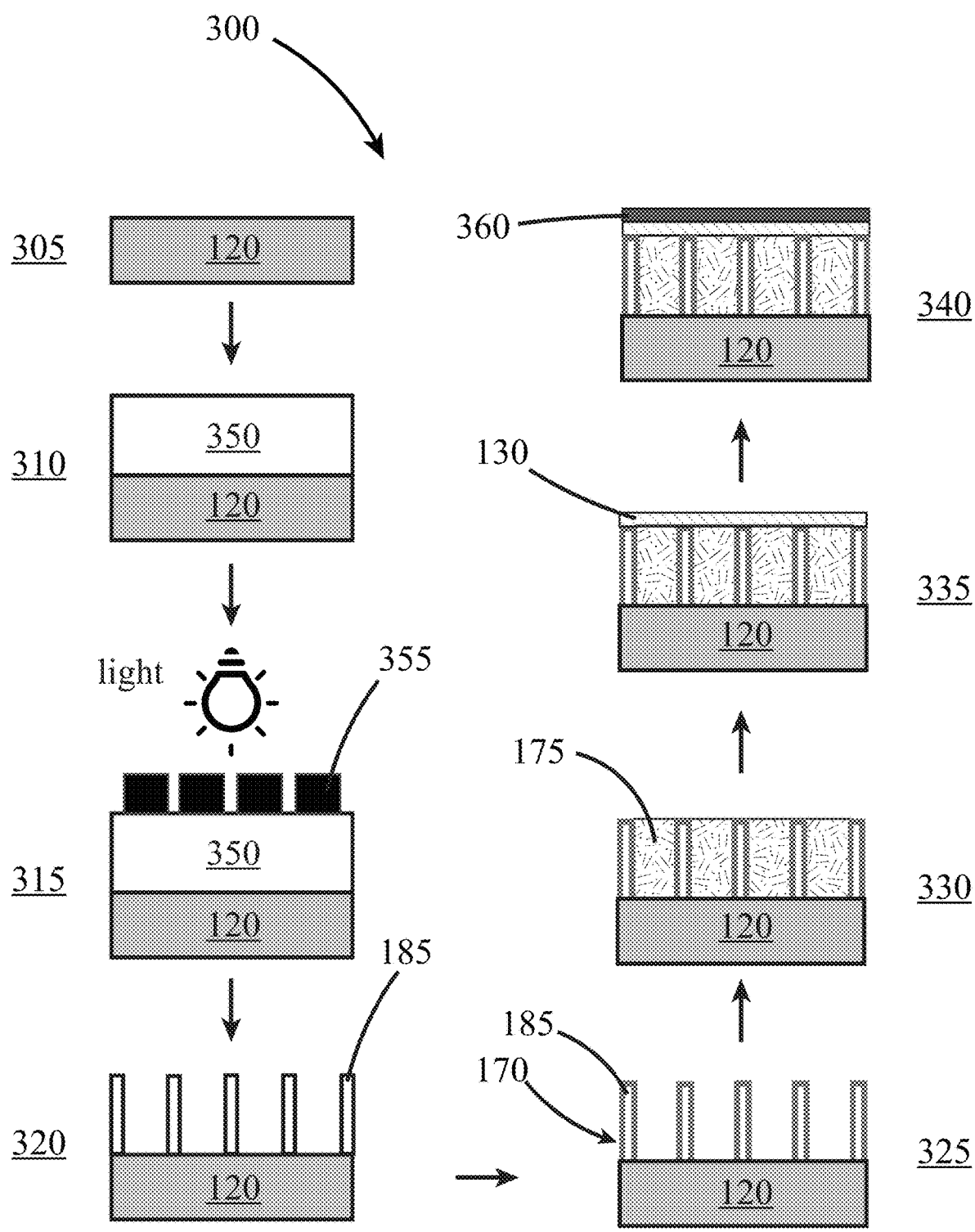
FIG. 3 illustrates a method that includes patterning a substrate, coating with a multilayer reflector, and depositing a scintillator material, according to some embodiments of the present disclosure.

FIG. 3 illustrates a method 300 for making a scintillator device 100, as described above, according to some embodiments of the present disclosure. In this exemplary method 100, the method begins with the providing 305 of a substrate 120. In some embodiments of the present disclosure, a substrate 120 may be glass, quartz, and/or sapphire. During, before, or after the providing 305 of the substrate 120, in some embodiments, the substrate 120 may be treated for downstream processing by cleaning the substrate 120. This may be accomplished by ultrasound in a solvent, such as isopropyl alcohol and/or acetone, followed by a UV and/or ozone treatment.

Once the substrate 120 is suitably prepared (i.e., cleaned), the method 100 may continue with the first depositing 310 of a photoresist onto the glass substrate 120. In some embodiments of the present disclosure, the first depositing 310 of a layer of photoresist 350 may be performed by coating the substrate 120 with a solution containing the photoresist material. Examples of solution processing methods for depositing a solution of photoresist onto a substrate 120 include at least one of spin coating, blade coating, curtain coating, slot-die coating, spray coating, and/or inkjet printing. In some embodiments of the present disclosure, a hot roll lamination of a solid form of a photoresist material may be used; e.g., dry SUEX®. In this case, a dry photoresist material, after being deposited onto the substrate, may be exposed to a heating step (not shown) to more uniformly distribute the solid photoresist on the substrate. For the example of SUEX® photoresist, the heating step was completed for five minutes at about 80° C.

After the first depositing 310 of the photoresist onto the substrate 120 is complete, the method 100 may proceed with a second depositing 315 of a photomask 355 onto the layer of photoresist 350. Materials suitable for acting as photomasks 355 include soda lime glass and/or quartz. For the example of a soda lime glass photomask 355, the soda lime may be deposited onto the photoresist 350 and then exposed to UV light followed by a heating step (light indicated in FIG. 3 by lightbulb symbol). For example, a soda lime glass photomask 355 may be exposed to UV light emitted by an Hg lamp having spectral lines at 365 nm, 405 nm, and 436 nm at a dose between about 1343 mJ/cm$^2$ (100 µm thick SUEX®) and about 3500 mJ/cm$^2$ (500 µm thick SUEX®). After the exposure to UV light, the photomask 355 may be subjected to heating at about 85° C. for a period of time between about 30 minutes (100 µm thick SUEX®) and about 45 minutes (500 µm thick SUEX®). In a negative photoresist, the regions exposed to UV light are polymerized or cross-linked and become much less soluble in a chemical developer, while in a positive photoresist the exposed regions undergo photodecomposition and their solubility increases in the developer. This change in solubility allows pattern transfer from the photomask to the photoresist.

Referring again to FIG. 3, in this exemplary method 300, the method may proceed with the developing 320 of the photoresist (i.e., selective dissolving of the photoresist). In this step of the method, the solubility change between the exposed and unexposed regions of the photoresist is utilized to selectively dissolve portions of the photoresist during immersion in a solvent. SUEX was developed in propylene glycol methyl ether acetate (PGMEA) for 35 minutes (100 µm thick SUEX®) to 140 minutes (500 µm thick SUEX®), followed by a 5 minute bath in isopropyl alcohol. The substrate and photoresist were then dried at 60° C. for 15 minutes in an oven. In some embodiments of the present disclosure, a side reflector 170, one or more layers, may be deposited by atomic layer deposition or through solution-processing techniques such as the growth of self-assembled monolayers of $SiO_2$ by threating the sidewalls 185 with one or more silanes. This step is described in more detail below.

Referring again to FIG. 3, after the third depositing 325 of the side reflectors 170 onto the sidewalls 185 is complete, the method may continue with a fourth depositing 330 of the semiconductor 175 (e.g., perovskite) into the cavities 160. Depending on the semiconductor 175 used, the fourth depositing may be performed by a solution processing method and/or by a vapor phase processing method. A specific example of a perovskite semiconductor 175 tested is $CsPbBr_3$ nanocrystals, which were synthesized by a hot injection method. Briefly, Cs-oleate was synthesized by adding 1.25 mmol $Cs_2CO_3$, 20 mL 1-octadecene, and 1.25 mL oleic acid to a three-neck flask and stirred under vacuum at 80° C. for 30 minutes. The temperature was raised to 150° C. and then the solution was held at 100° C. until use. In a second three-neck flask, oleylammonium was synthesized by heating 2.5 mL oleic acid and 2.5 mL oleylamine at 130° C. under vacuum for 30 minutes. In a third three-neck flask, $PbBr_2$ was combined with 25 mL 1-octadecene and dried under vacuum at 125° C. for 30 minutes. The oleylammonium was then injected into the $PbBr_2$ solution under $N_2$. After 10 minutes, the temperature of the $PbBr_2$ solution was raised to 185° C. and 2 mL of Cs-oleate were injected. The $CsPbBr_3$ nanocrystal solution was immediately cooled in an ice bath. The $CsPbBr_3$ nanocrystals were then added to 50 mL of methyl acetate and centrifuged at 7500 rpm for 5 minutes. The supernatant was poured off and the concentrated nanocrystal colloid was doctor blade coated onto the grid 180, filling the cavities 160.

The top reflector 335 may include one or more layers of higher and lower index of refraction materials relative to the scintillator. The low index material may be an oxide such as at least one of $SiO_2$, $Al_2O_3$, IZO, IGZO, IZTO, or MgO. The metal may include at least one of Ag, Au, Al and/or any other suitable metal. The materials may be deposited using chemical vapor deposition, atomic layer deposition for oxides and metals or thermal evaporation, and/or solution-process methods such for polymers and nanoparticles of the above materials include spray coating, slot-die coating, blade coating, spin-coating, and inkjet printing. The protective encapsulation may consist of Al deposited via thermal evaporation or laminated as a foil with thicknesses from 0.5 to 50 µm, Be laminated as a foil with thicknesses from 25 to 1500 µm, or a glass with a polymer edge sealant such as polyisobutene, polyvinyl butyral, and/or thermoplastic polyurethane with packaging processes comparable to those used for commercial x-ray detectors.

EXPERIMENTAL RESULTS

Figure 4:
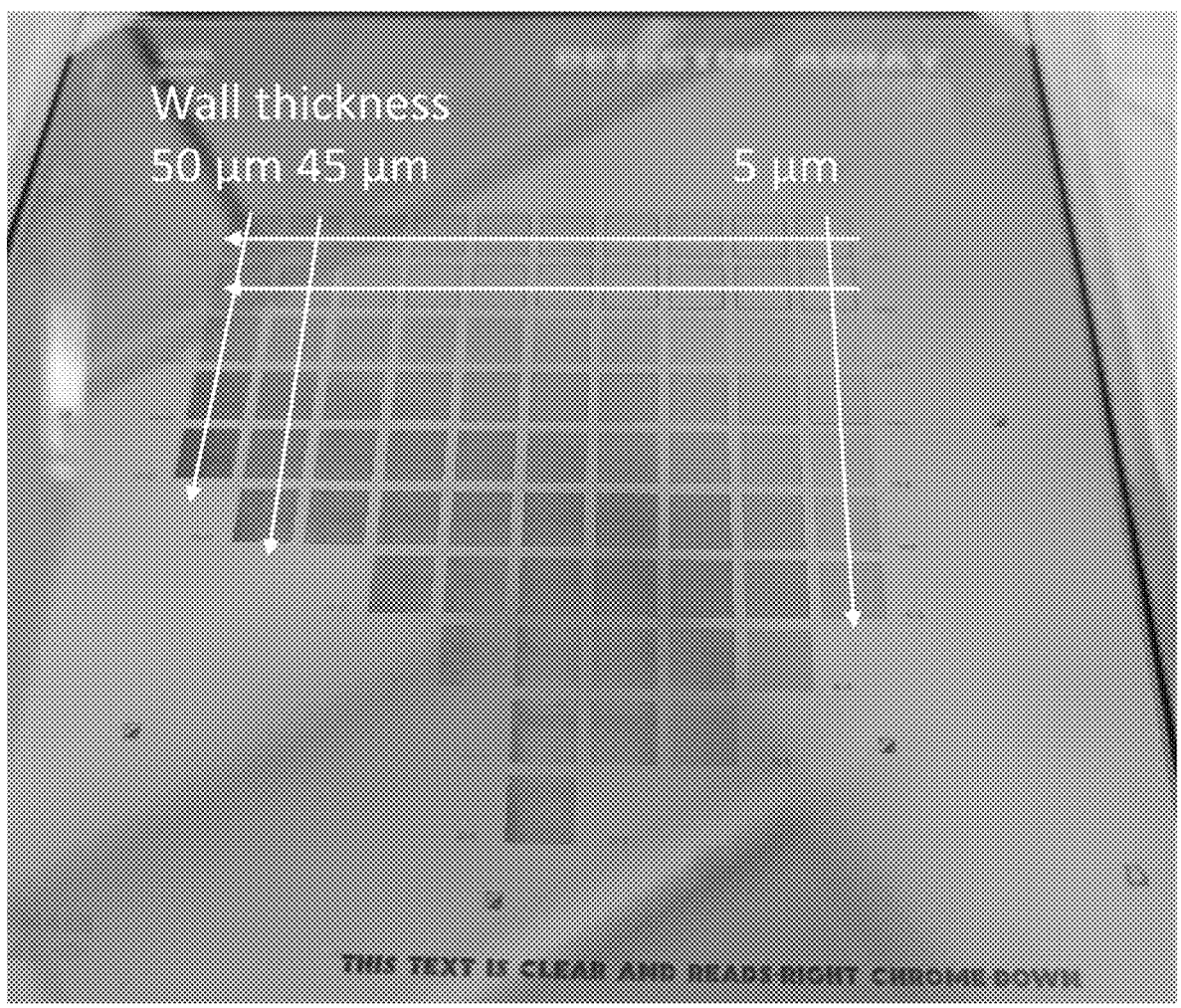
FIG. 4 illustrates a soda lime glass photomask, according to some embodiments of the present disclosure.

FIG. 4 illustrates a soda lime glass mask that was constructed for a negative photoresist with 25 mm$^2$ arrays for making cavities having widths between about 10 µm and about 250 µm and sidewall thicknesses between about 5 µm and about 50 µm. FIG. 5 illustrates grids of cavities developed on a glass substrate using the photomask in illustrated in FIG. 4, with some showing delamination from the substrate (blank areas or peeling edges). Panel B is a magnification of the area highlighted in the box in Panel A. Delamination is detrimental for cavity filling during blade coating, as cavities fail to retain the solution-processed scintillator but can be avoided by polishing glass substrates to further reduce surface defects or by designing wider UV exposed regions around the cavity arrays to increase the surface area in contact with the substrate. Alternatively, delamination can be exploited for reflector deposition. To avoid coating the transparent substrate during reflector deposition, where light must pass through to the underlying detector electronics, the free-standing photoresist can be coated with the reflector and subsequently re-laminated onto a transparent substrate. This can be achieved by depositing a film of optically transparent epoxy onto the substrate, for example, followed by hot roll lamination of the patterned photoresist on the epoxy coated substrate, and finally UV or thermal curing.

Figure 6:
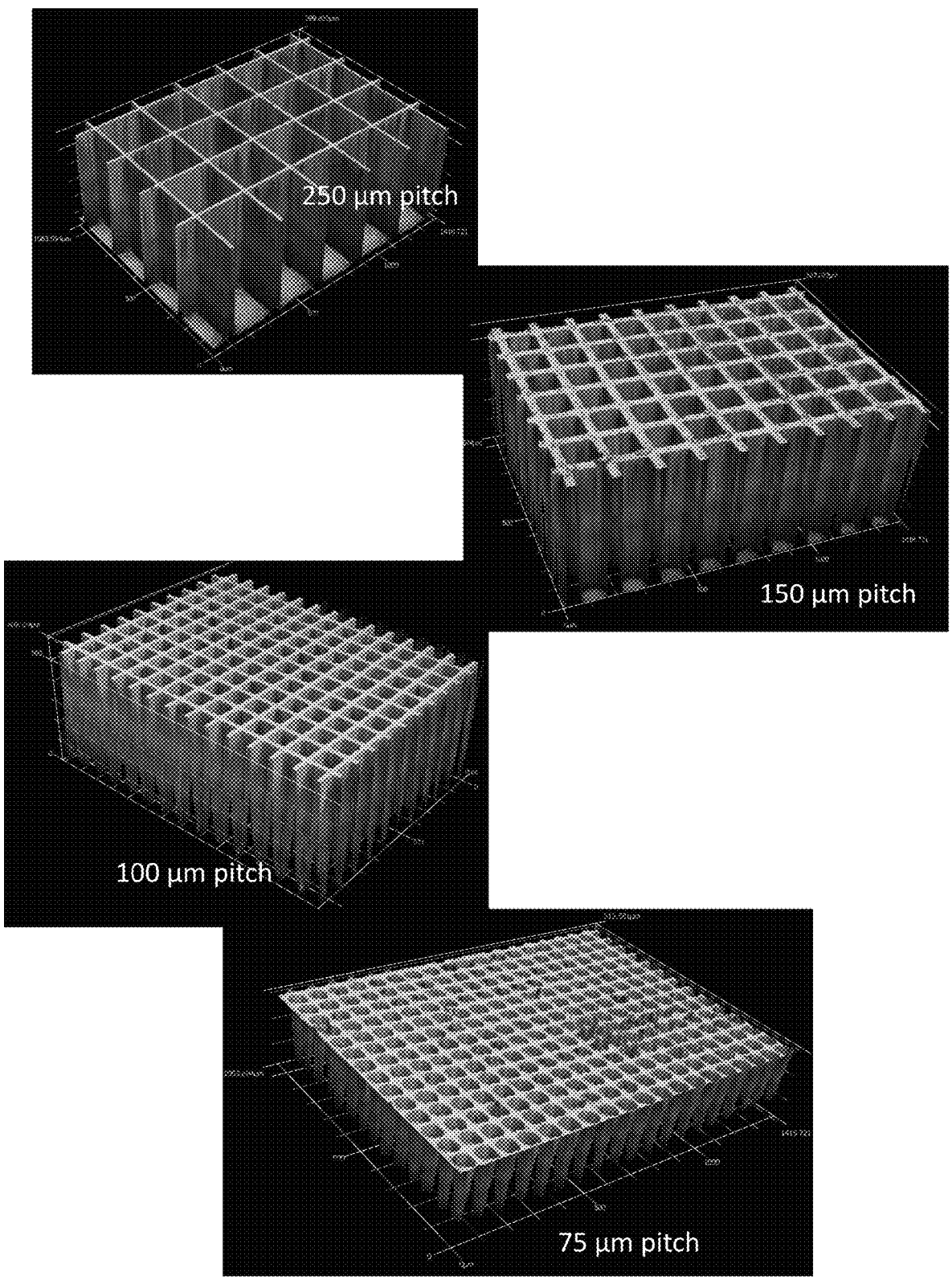
FIG. 6 illustrates grids of cavities with pitches between 75 and 250 μm, according to some embodiments of the present disclosure.

FIG. 6 illustrates cavities with pitches between 75 and 250 µm in 500 µm thick SUEX®, where pitch is the distance between the center of adjacent cavities and having sidewall thicknesses between 15 and 30 µm. Cavities with 75 µm pitch were not developed adequately for the cavity depth to reach the glass substrate, indicating a process limitation. In x-ray imaging applications, the incident x-ray attenuation would be determined by the depth of the cavity and the scintillator material's linear attenuation coefficient, and the spatial resolution would be determined primarily by the cavity pitch and the sidewall reflectance.

Figure 8:
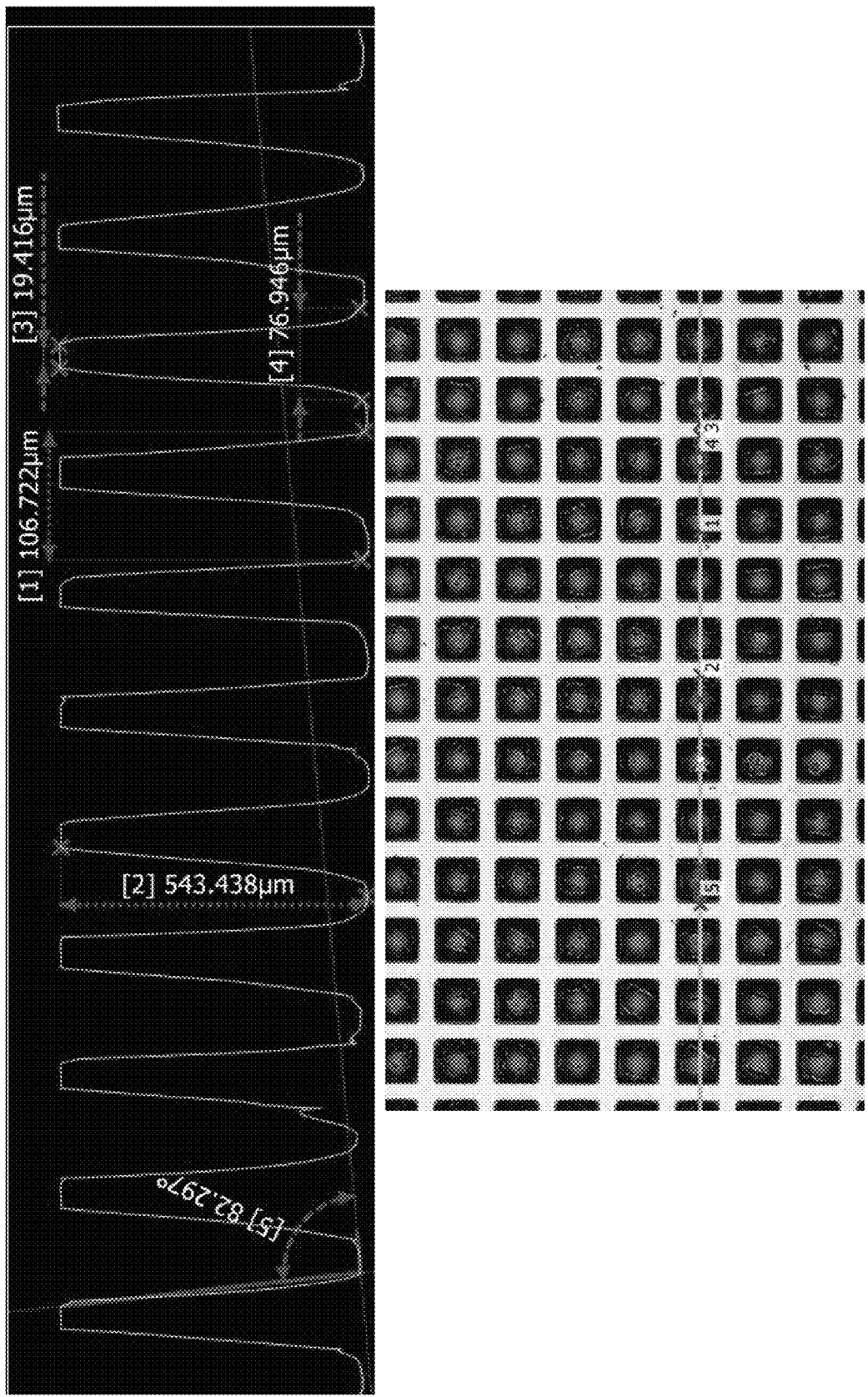
FIG. 8 illustrates a cross-sectional line profile for a grid having 100 µm pitch cavities, according to some embodiments of the present disclosure.

FIG. 7 illustrates a cross-sectional line profile of 250 µm pitch cavities developed in 500 µm thick SUEX® and acquired with a Keyence laser scanning confocal microscope. The bottom panel illustrates an annotated, optical microscope image of the same line profile. The intended minimum feature size, a sidewall thickness of 25 µm, gives an aspect ratio of 25. The varying sidewall angles and thicknesses indicate process variability between cavities. FIG. 8 illustrates a cross-sectional line profile of 100 µm pitch cavities developed in 500 µm thick SUEX®. The sidewall angles are reduced relative to FIG. 7 and some cavities show unintended, residual resist near the bottom. These process limitations are ascribed to limited mass transport of developed resist out of the cavity and restriction of the flow of unsaturated developer into the cavity.

Figure 9:
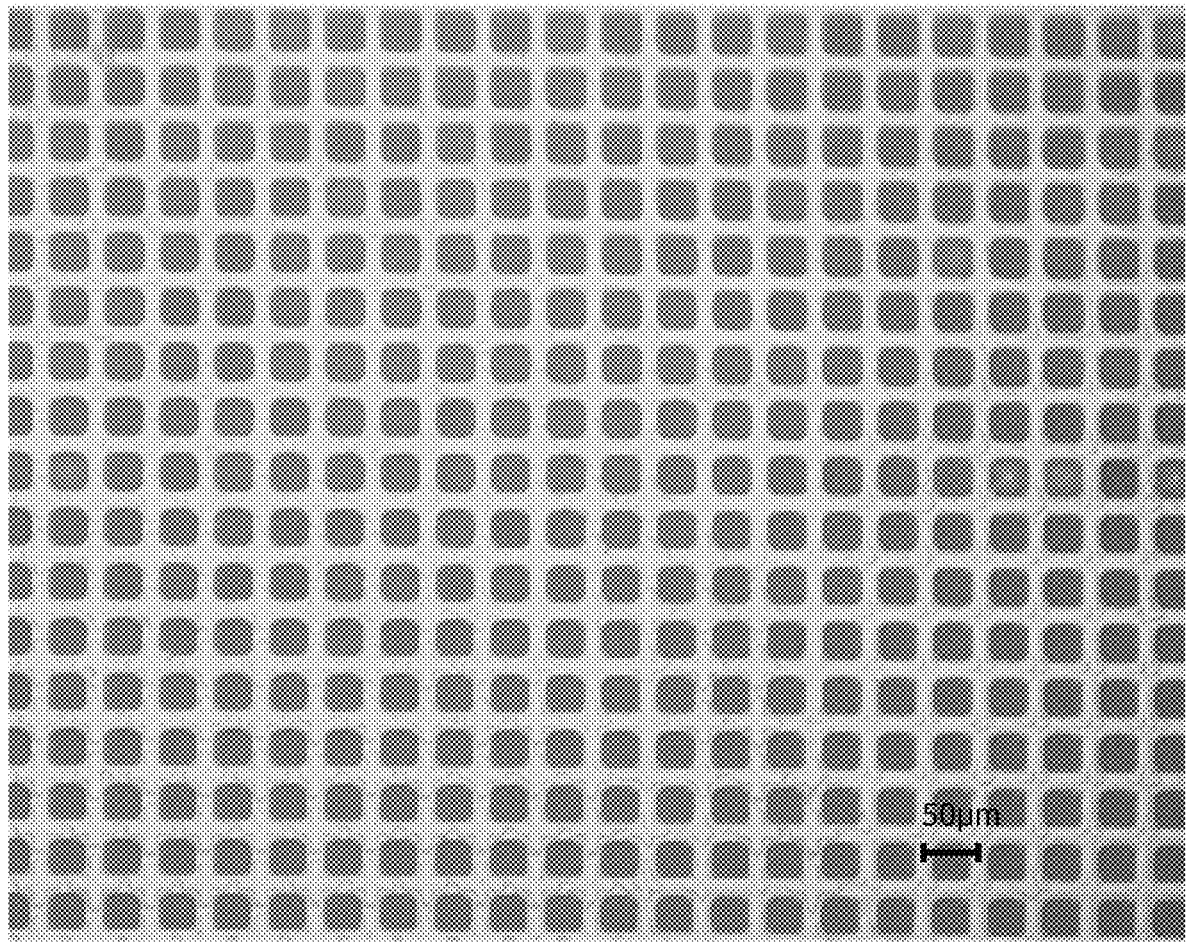
FIG. 9 illustrates an optical microscope image of a grid of 50 µm pitch cavities, according to some embodiments of the present disclosure.
Figure 10:
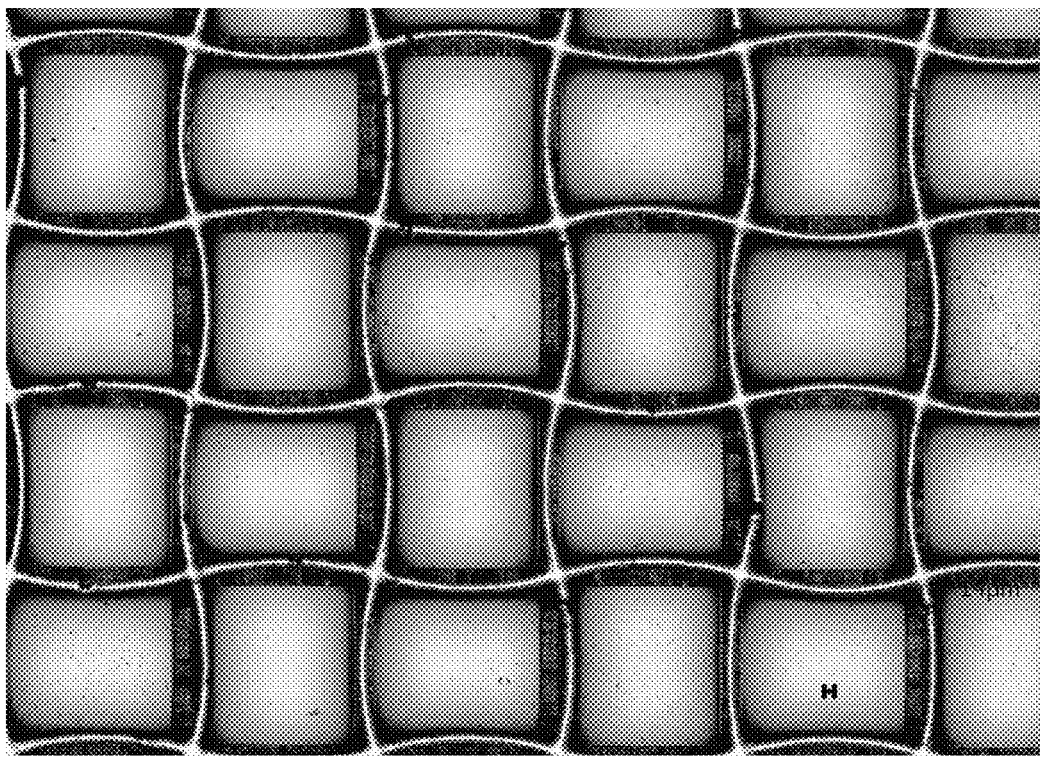
FIG. 10 illustrates sidewall buckling in a grid of cavities having an aspect ratio of 20 in with 500 µm deep cavities, according to some embodiments of the present disclosure.

FIG. 9 illustrates an optical microscope image of 50 µm pitch cavities developed in 500 µm thick SUEX®. These cavities were shallower than those of 75 µm pitch, shown in FIG. 6, and exhibited varying degrees of undesired sidewall dissolution during extended development times reaching 3 hours, as can be seen to the left of the scale bar. FIG. 10 illustrates sidewall buckling at an aspect ratio of 20 in 500 µm thick SUEX® indicates aspect ratio limits for the process. The buckling behavior is ascribed to stress induced by a coefficient of thermal expansion mismatch between the glass substrate and the photoresist, and the relatively rapid cooling rate after the post exposure bake of about 2° C. per minute. The buckling may be reduced or eliminated using much slower cooling rates (e.g., 5° C. per hour), but a programmable ramping oven was unavailable for this experiment.

Figure 11:
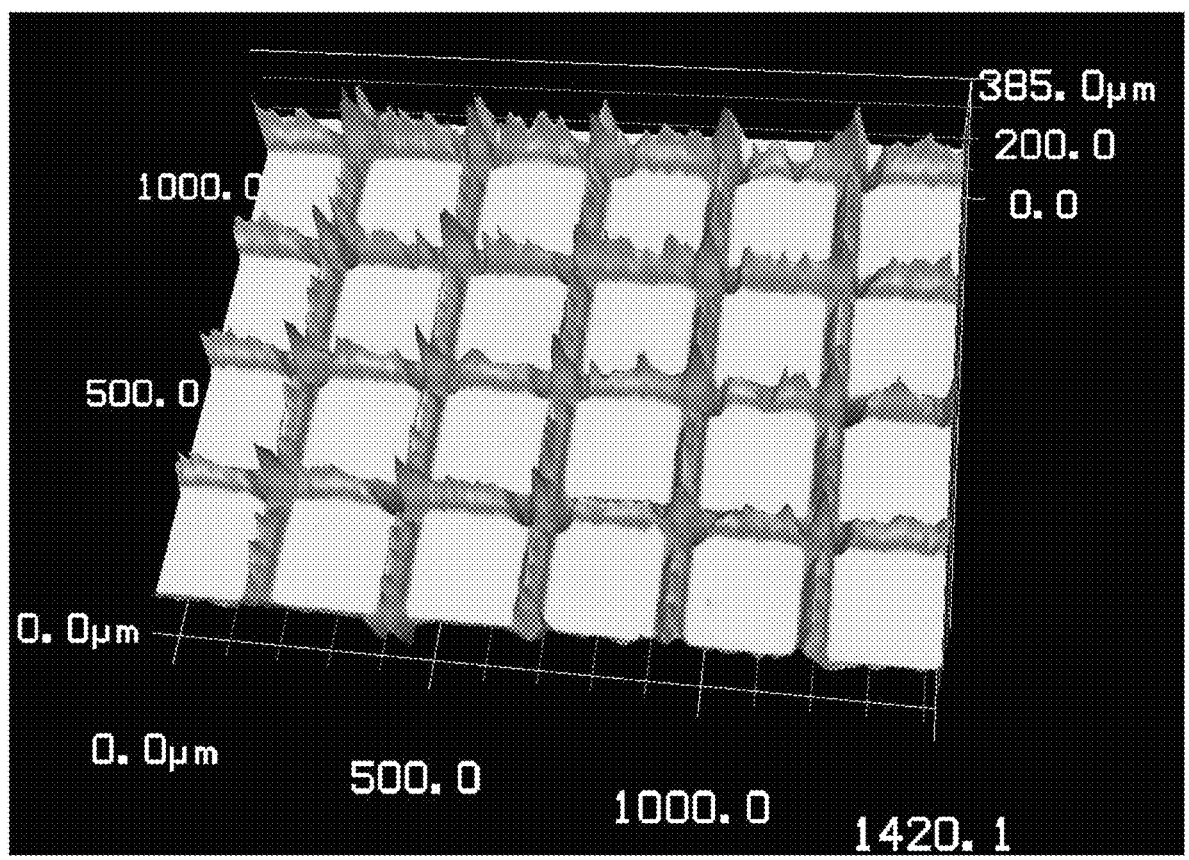
FIG. 11 illustrates results obtained from extending development time in propylene glycol methyl ether acetate, according to some embodiments of the present disclosure.

FIG. 11 illustrates results obtained from extending development time in propylene glycol methyl ether acetate from 140 minutes at 22° C. to 180 minutes at 26° C. shows sidewall dissolution in 500 µm thick SUEX®, placing bounds on the development process and indicating that arbitrarily long development times or increased temperatures may not allow for further reducing cavity pitch at this photoresist thickness. The image was acquired with a Keyence laser scanning confocal microscope.

Figure 12:
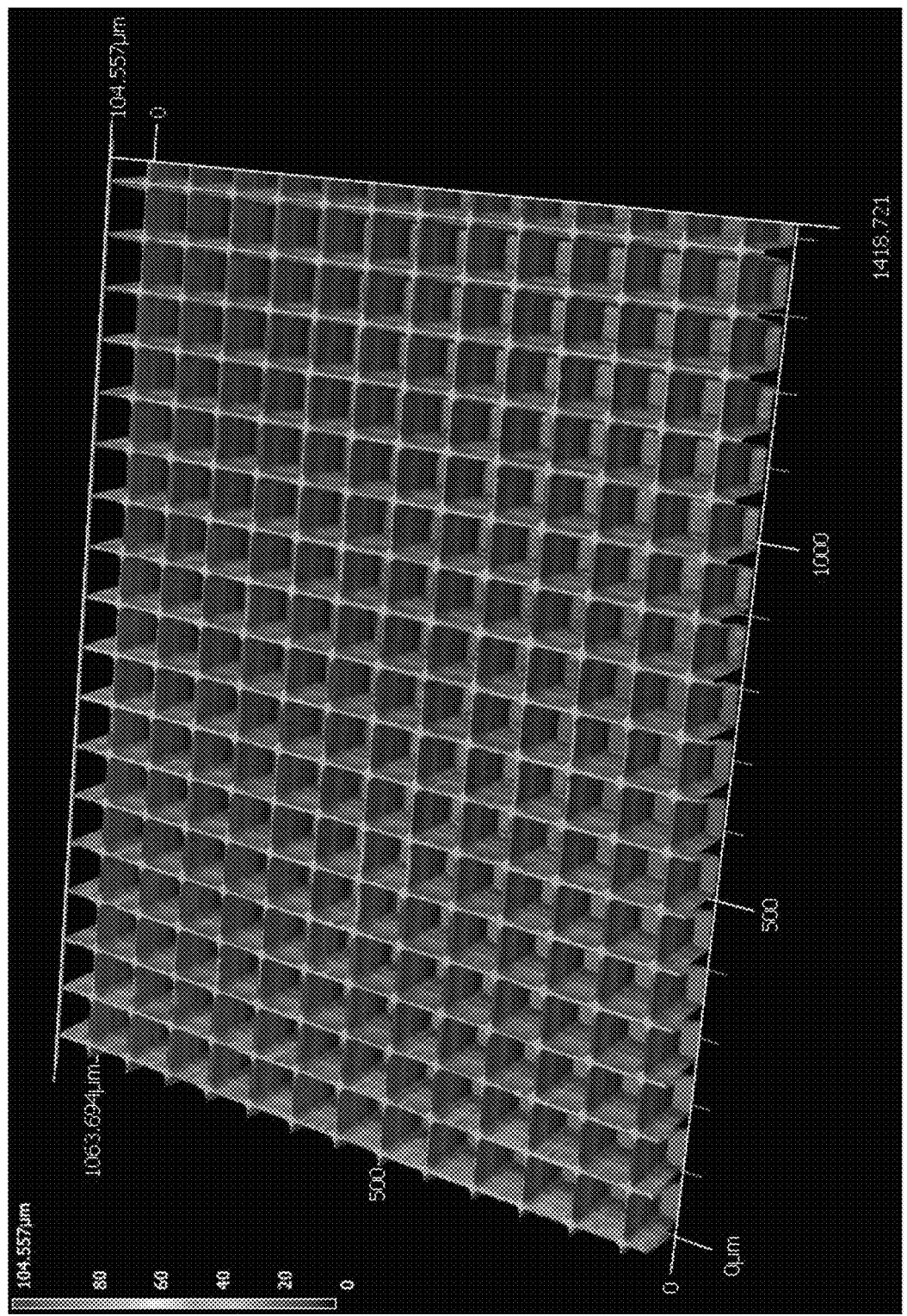
FIG. 12 illustrates a grid of cavities having a 75 µm cavity pitch, according to some embodiments of the present disclosure.

FIG. 12 illustrates an example of a device having a 75 µm cavity pitch, which is comparable to the pixel pitch of state-of-the-art CMOS x-ray detectors, developed in 100 µm thick SUEX®. These cavities exhibit complete development through to the glass substrate and improved uniformity relative to the 500 µm thick SUEX®, indicating that higher spatial resolution can be achieved through reduced cavity pitch without further process refinement. This illustrates a trade-off between radiation dose and spatial resolution, where reduced scintillator volumes can achieve higher spatial resolution but may not offer the desired attenuation to maximize the light output (signal). In a medical setting, minimizing patient dose is a priority and thus scintillator thicknesses are commonly 100's of µm and greater to attenuate as much of the incident x-ray energy as reasonably possible within the scintillator volume and to maximize the light output. In industrial quality control or in some security settings (e.g. baggage screening) the trade-off to increase spatial resolution at the cost of greater x-ray dose may be more acceptable than in a medical setting.

Figure 14:
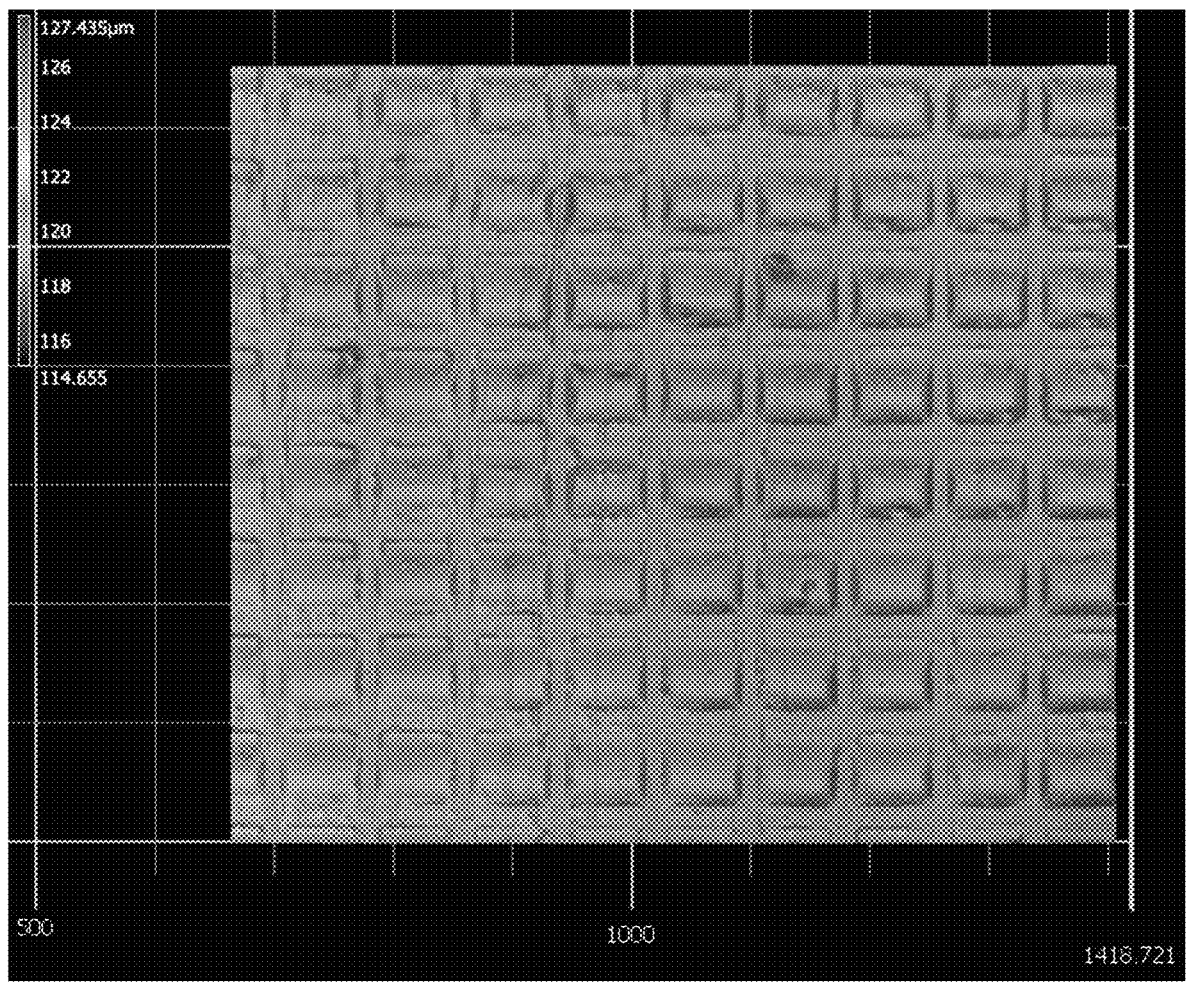
FIG. 14 illustrates a grid of cavities have 75 µm widths, filled with $CsPbBr_3$ nanocrystal semiconductor material, according to some embodiments of the present disclosure.

FIG. 13 illustrates a cross-sectional line profile of 75 µm cavity widths developed in 100 µm thick SUEX® gives further quantification of results from FIG. 12. FIG. 14 illustrates a grid of cavities have 75 µm widths developed in 100 µm thick SUEX® after doctor blade coating $CsPbBr_3$ nanocrystal semiconductor material, showing relatively uniform and consistent cavity filling. This indicates that blade coating provides a suitable method of manufacture to fill patterned substrates with solution-processed scintillators. FIG. 14 illustrates an optical profilometer image of the grid illustrated in FIG. 12 after depositing a coating (using a doctor blade method) $CsPbBr_3$ perovskite nanocrystal semiconductor onto the grid. The depositing of the semiconductor uniformly filled all of the cavities.

FIG. 15 illustrates a 0.3 mm thick Pb foil x-ray resolution test pattern (labeled "Test Pattern" in FIG. 15), with numbers denoting the spatial resolution in terms of line pairs per millimeter (lp mm$^{-1}$). Photograph of the patterned scintillator in FIG. 14 under Cu K-α x-rays (8.04 keV) showing individual cavities. Vertical line pairs are resolvable at 6 and 7 lp mm$^{-1}$ (labeled "Patterned Detector" in FIG. 15). An unpatterned $CsPbBr_3$ film of 100 µm thickness under Cu K-α x-rays, where vertical linepairs are not resolvable (labeled "Unpatterned Detector" in FIG. 15). These results demonstrate that solution-processed scintillators can be deposited into patterned substrates to improve spatial resolution, which is a figure of merit for scintillator detectors due to the demand for improved image detail in many x-ray imaging applications. The $CsPbBr_3$ material was taken from the same synthesis batch and used in both detectors, patterned and unpatterned.

Referring again to FIG. 15, the numbers at the top of image denote the line pairs per mm (e.g., 6, 7, 8, 9, and 10). The top image shows a metal/lead test pattern. The transparent, lighter colored lines allowed x-rays to pass through the metal into the semiconductor material. The goal of this experiment was to observe clearly defined vertical lines in the semiconductor material, but these blurred to varying degrees depending on the resolution of the grid of cavities provided (Patterned Detector).

Referring again to FIG. 15, shows that the device illustrated in FIG. 14 having a grid of cavities filled with $CsPbBr_3$ nanocrystal semiconductor demonstrated improved spatial resolution relative to an unpatterned $CsPbBr_3$ film of the same thickness, where pairs of lines are not distinguishable in the unpatterned film. The spatial resolution enhancement results from total internal reflection at the sidewalls due to a refractive index mismatch between the semiconductor material, $CsPbBr_3$, and the sidewall material with the $CsPbBr_3$ semiconductor and from absorption of emitted light by the sidewalls that reduces optical crosstalk between cavities, i.e., less transmission of light through the sidewalls of adjacent cavities. Deposition of one or more layers of lower refractive index materials into the cavities onto the inner surfaces of the sidewalls (FIG. 3, subfigure 6) can greatly enhance total internal reflection at the scintillator-sidewall interface by increasing the refractive index mismatch. The patterned and unpatterned scintillators were excited with Cu K-α x-rays (8.04 keV) from a Rigaku D/MAX diffractometer.

In some embodiments of the present disclosure, a nanocrystalline perovskite semiconductor for a scintillator device may include a wide band gap, e.g., greater than 2.2 eV, first semiconductor material at a high concentration such as $CsPbBr_3$, mixed with a low concentration of a narrower band gap, e.g., less than 2.2 eV, perovskite, i.e., second semiconductor material, referred to herein as the "dopant", with examples including $FA_{1-x}Cs_xPbBr_3$, $CsPbI_{1-x}Br_x$, CdSe, and/or PbS. Halide migration can limit the stability of such mixtures of perovskites (e.g., mixtures of a first high bandgap semiconductor and a second low bandgap semiconductor), resulting in a material with a more homogeneous bandgap. Thus, some embodiments of the present disclosure describe perovskite synthesis methods that limit or eliminate the migration of cations or anions within the perovskite composition. In some embodiments of the present disclosure, cation migration may be reduced and/or eliminated by the inclusion in the perovskite composition of at least one of a ligand (e.g., a bulky, branched and/or cross-linked molecule), dissimilar metals, and/or core/shell materials. In some embodiments of the present disclosure, a B-site cation for a first semiconductor perovskite and/or a second semiconductor perovskite may include other elements such as Sn, Cu, or Bi, as at least one of a total substitute for lead (e.g., $CsSnBr_3$, $CsCuBr_3$) or a partial substitute for lead (e.g., $CsSn_xPb_{1-x}Br_3$).

The band gap of perovskite nanocrystals may be engineered through the selection of the X-site anion (e.g., halides), since it has been challenging to achieve quantum confinement by synthesizing cubic nanocrystals with dimensions below the Bohr exciton radius. An additional approach described herein is to utilize morphology control to achieve quantum confinement in the wider gap matrix material. Approaches for confinement include the use of at least one of hollow perovskite nanocrystals, divalent cations, nanowires/nanorods, and/or nanosheets/nanoplatelets. The dopant perovskite in such a matrix material may include nanocrystals of a different morphology with the same atomic composition, nanocrystals with the same morphology and a different atomic composition, and/or non-perovskite nanocrystals.

Second, for bulk scintillators, a wider band gap perovskite matrix may incorporate at least one lower gap 2D perovskite dopant. In 2D perovskites such as those of Dion-Jacobson and Ruddlesden-Popper phases, larger organic cations may act as spacers that can isolate and confine a number of interior perovskite layers. 2D phases have been shown to phase segregate within a 3D bulk perovskite when a single precursor solution containing both 2D and 3D materials is deposited via spin coating and thermal annealing. Thus, such a "single pot" approach may allow for the self-assembly of a scintillator material that has distinct phases with both a wide band gap and a narrow band gap, simplifying material processing and eliminating the need for sequential deposition steps or dopant diffusion through the matrix from a post-deposition surface treatment. While phase segregation may allow for visible spectrum emission from a small fraction of 2D dopants within a 3D perovskite matrix, this approach has not yet been applied to perovskite scintillators. An additional matrix-dopant approach proposed here is a wider gap bulk perovskite incorporating perovskite nanocrystals and/or nanocrystals of another material (CdSe, PbS, Si).

The present disclosure also relates to methods for increasing the light output and spatial resolution of scintillator device using perovskite semiconductors, both of which are figures of merit for scintillator-based imaging systems. Referring to FIG. 3, in some embodiments of the present disclosure, a method to pattern a pixelated perovskite scintillator may utilize, among other things, nanoimprint lithography. For example, first, a polymer resist such as PMMA or SU-8 may be deposited onto a substrate. A master template coated with an anti-stick self-assembled monolayer (typically an organosilane) may subsequently be pressed into the resist, followed by curing the resist thermally and/or via ultraviolet exposure. Next, the resist and master may be separated, leaving an array of trenches, as shown in FIG. 3.

Next, the array of trenches may be coated with a reflector constructed of a single layer of material or multiple layers of material. Maximizing reflectivity is important, since most photons will be reflected several times before reaching the photodiode at the bottom of the scintillator where the light intensity will be $R^AN$ (R=reflectivity, N=number of reflections). Simple semiconductor-metal reflectors have a reflectivity of 97.4% at a $CsPbBr_3$—Ag interface, or 66.3% for $CsPbBr_3$—Au (computed using Fresnel equations with published refractive index values). However, metals in direct contact with metal halide perovskites pose long-term stability concerns as they readily diffuse into the perovskite and, in the case of some metals, can also chemically react (e.g. forming silver halides or corroding aluminum). Both diffusion and chemical reactions degrade the optoelectronic quality of the perovskite and reduce the reflectivity of the metal.

An alternative to semiconductor-metal reflectors is to use a distributed Bragg reflector (DBR) comprised of alternating, quarter wavelength thick layers of dielectric with different refractive indices. Reflectivity in excess of 99% for incident light with wavelengths within the DBR stopband can be achieved. However, the stop band of DBRs shifts towards shorter wavelengths for larger angles of incidence, resulting in a reflector that becomes transparent at large angles. In the case of isotropic emission, such as that in LED's and scintillator devices, the integrated reflectivity over all incident wavelengths is only about 50% for DBRs.

In some embodiments of the present disclosure, a scintillator device may include a three-layer omnidirectional reflector that includes a stack of at least three elements in the following order: a perovskite composition as described herein, a low index material, and a metal. The integrated reflectivity of up to 99% over all angles of incidence for an omni-directional reflector constructed of $Ag/SiO_2$/perovskite is estimated to be achievable, in some embodiments of the present disclosure. In some of the methods described here, the low index material serves a dual role, enhancing refractive index contrast for higher reflectivity and physically isolating the perovskite from potentially reactive metals. The low index material is ideally a quarter wavelength in thickness and may consist of a variety of polymers including poly(methylmethacrylate), polydimethylsiloxane (PDMS), or polystyrene (PS), however is not limited to these polymers and other suitable polymer may also be used. The low index material may be an oxide such as at least one of $SiO_2$, $Al_2O_3$, IZO, IGZO, IZTO, or MgO. The metal may include at least one of Ag. Au, Al and/or any other suitable metal. A high aspect ratio of the trench pattern under the reflector may be achieved using a conformal coating process such as superconformal chemical vapor deposition, atomic layer deposition for oxides and metals, and/or conformal spray coating for polymers.

Perovskite Nanocrystals. In this system, quantum confinement is limited. A minority phase, with a different composition and narrower bandgap than the host phase, limits reabsorption. Energy transfer between the host and minority phase is primarily radiative. Details of an example, according to some embodiments of the present disclosure are as follows:
  a. Material includes a dopant, at ≤1% concentration relative to the matrix, with $ABX_3$ stoichiometry.
  b. The matrix material may be $CsPbCl_3$, while the dopant may be $CsPbBr_3$. The absorption/emission overlap may be further tuned by incorporating formamidinium into the minority phase, giving $FA_{1-x}Cs_xPbBr_3$.
  c. The nanocrystals with polydispersity may be used to further limit reabsorption.
  d. The nanocrystals may incorporate aromatic ligands, such as benzylamine and benzoic acid, to improve radiation hardness
  e. Nanocrystals may also incorporate branched ligands to inhibit cation or anion exchange between the matrix and dopant. Branched ligands include (3-aminopropyl) triethoxysilane (APTES) and trioctylphosphine oxide (TOPO).

Perovskite Nanoplatelets. In this system, quantum confinement is strong. Confinement results from a tunable number of perovskite unit cells sandwiched between bulky organic cations. Energy transfers from platelets with fewer layers (donor, wider gap) to more layers (emitter, narrower gap). Reabsorption is inhibited by incorporating nanoplatelets with a varying number of n unit cells into the same scintillator, rather than by tuning composition as with the nanocrystals above. Energy transfer is primarily non-radiative (Forster). Details of an example, according to some embodiments of the present disclosure are as follows:
  a. Nanoplatelets have $L_2(A)_{n-1}Pb_nX_{3n+1}$ stoichiometry, where n is the thickness of the platelet in terms of the number of complete perovskite unit cells. L is an organic ligand that restricts nanoplatelet growth in one direction due to its large size and inability to fit within the unit cell.
  b. The A site may include Cs, formamidinium, or methylammonium, the B site will be Pb, and the X site may include Cl, Br, or I. An example includes $FA_{1-x}Cs_xPbBr_3$ where x=0 to 1.
  c. The material will include nanoplatelets with the number of layers ranging from n=1 to n=6. Nanoplatelets with low n values demonstrate low photoluminescence quantum yield, possibly due to restricted polaron formation and reduced screening of defects. The nanoplatelets with larger n values reduce reabsorption from the less emissive, lower n platelets.
  d. Tuning the ligand ratio allows the formation of ensemble nanoplatelets, with adjacent regions of n layers (e.g. an ensemble of n=2 and n=3 stacked together), allowing fast non-radiative energy transfer. 1
  e. The nanoplatelet ligands may include butylammonium X, hexylammonium X, octylammonium X, octylamine, octanoic acid, di-dodecyl dimethyl ammonium X, or other organic molecules in the +1 oxidation state. X=Cl, Br, I (but most likely Br).
  f. The nanoplatelets may incorporate aromatic ligands, such as benzylamine and benzoic acid, to improve radiation hardness
  g. Nanoplatelets may also incorporate branched ligands to inhibit the merging of nanoplatelets into platelets of higher n or bulk materials, a commonly observed phenomenon that impairs long term stability. Branched ligands include (3-aminopropyl) triethoxysilane (APTES) and trioctylphosphine oxide (TOPO).

EXAMPLES

Example 1. A device comprising: a substrate; a grid comprising a plurality of cavities; and a semiconductor substantially filling each cavity, wherein: each cavity is positioned on the substrate, each cavity is defined by at least three sidewalls positioned substantially perpendicular to the substrate, the semiconductor is configured to absorb an incoming light, the semiconductor is configured to emit a light as a result of absorbing the incoming light, each cavity is configured to direct at least a portion of the emitted light to the substrate, and the substrate is substantially transparent to the emitted light.

Example 2. The device of Example 1, further comprising: a photodiode, wherein: the substrate is positioned between the grid and the photodiode, and the photodiode is configured to absorb the emitted light and convert the absorbed emitted light to an electrical signal.

Example 3. The device of either Example 1 or Example 2, further comprising: a complementary metal oxide semiconductor (CMOS) ship, wherein: the photodiode is positioned between the substrate and the CMOS chip.

Example 4. The device of any one of Examples 1-3, wherein: a surface of each sidewall is substantially covered by a side reflector, the surface is substantially perpendicular to the substrate, and the side reflector is configured to direct the emitted light to the substrate.

Example 5. The device of any one of Examples 1-4, further comprising: a top reflector positioned adjacent to the plurality of cavities, wherein: the plurality of cavities is positioned between the top reflector and the substrate.

Example 6. The device of any one of Examples 1-5, further comprising: an encapsulating layer positioned adjacent to the top reflector, wherein: the top reflector is positioned between the encapsulating layer and the plurality of cavities.

Example 7. The device of any one of Examples 1-6, wherein the incoming light comprises x-rays.

Example 8. The device of any one of Examples 1-7, wherein the emitted light has a wavelength between about 400 nm and about 550 nm.

Example 9. The device of any one of Examples 1-8, wherein the semiconductor comprises at least one of a perovskite, CdSe, $Cs_3Cu_2I_5$, or PbS.

Example 10. The device of any one of Examples 1-9, wherein the perovskite comprises at least one of $FA_{1-x}Cs_xPbBr_3$ or $CsPbI_{3-y}Br_y$.

Example 11. The device of any one of Examples 1-10, wherein each cavity has a depth between about 50 μm and about 5 mm.

Example 12. The device of any one of Examples 1-11, wherein the depth is between about 250 μm and about 1 mm.

Example 13. The device of any one of Examples 1-12, wherein the top reflector is constructed of at least one of beryllium, aluminum, or amorphous carbon.

Example 14. The device of any one of Examples 1-13, wherein the top reflector has a thickness between about greater than zero μm and about 500 μm.

Example 15. The device of any one of Examples 1-14, wherein the substrate is constructed of a plurality of glass optical fibers.

Example 16. The device of any one of Examples 1-15, wherein each glass optical fiber has a dimension of about one μm.

Example 17. The device of any one of Examples 1-16, wherein each cavity has an outside width between about 1 μm and about 250 μm.

Example 18. The device of any one of Examples 1-17, wherein the outside width is between about 1 μm and about 10 μm.

Example 19. The device of any one of Examples 1-18, wherein each sidewall has a thickness between about 1 μm and about 500 μm.

Example 20. The device of any one of Examples 1-19, wherein the thickness is between 1 μm and about 50 μm.

Example 21. The device of any one of Examples 1-20, wherein the grid has between 1 million and 1,000 million cavities.

Example 22. The device of any one of Examples 1-21, wherein each cavity has a cross-sectional shape comprising at least one of a triangle shape, a square shape, a rectangular shape, or any other polygonal shape.

Example 23. The device of any one of Examples 1-22, wherein the side reflector is constructed of at least one of gold, silver, aluminum, copper, $SiO_2$, $TiO_2$, or $SnO_2$.

Example 24. The device of any one of Examples 1-23, wherein the side reflector has a thickness between about 50 nm and about 250 nm.

Example 25. A method of making a device, the method comprising, in order: depositing a layer of a photoresist onto a substrate; depositing a mask onto the photoresist; developing the photoresist, resulting in the forming of a grid comprising a plurality of cavities; and depositing a semiconductor onto the grid, resulting in substantially filling each cavity with the semiconductor.

Example 26. The method of Example 25, further comprising depositing a top reflector onto the grid and the semiconductor.

Example 27. The method of either Example 25 of Example 26, further comprising depositing an encapsulating layer onto the top reflector.

Example 28. The method of any one of Examples 25-27, wherein depositing the semiconductor is performed by a solution processing method.

Example 29. The method of any one of Examples 25-28, wherein the depositing comprises coating the grid with a solution comprising a perovskite.

Example 30. The method of any one of Examples 25-29, wherein the perovskite comprises at least one of $FA_{1-x}Cs_xPbBr_3$ or $CsPbI_{3-y}Br_y$.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations, may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A scintillator comprising:
   a substrate;
   a plurality of cavities; and
   a semiconductor at least partially filling each cavity, wherein:
   each cavity is defined by the substrate and at least three sidewalls comprising a photoresist, with each sidewall positioned substantially perpendicular to the substrate,
   each sidewall is at least partially covered by a side reflector, and
   the substrate is substantially transparent.

2. The scintillator of claim 1, further comprising a photodiode, wherein the substrate is positioned between the plurality of cavities and the photodiode.

3. The scintillator of claim 2, further comprising:
   a complementary metal oxide semiconductor (CMOS) chip or a thin film transistor (TFT) array, wherein:
   the photodiode is positioned beneath the substrate and within the CMOS chip or TFT array.

4. The scintillator of claim 1, further comprising:
   a top reflector positioned adjacent to the plurality of cavities, wherein:
   the plurality of cavities is positioned between the top reflector and the substrate.

5. The scintillator of claim 4, further comprising:
   an encapsulating layer positioned adjacent to the top reflector, wherein:
   the top reflector is positioned between the encapsulating layer and the plurality of cavities.

6. The scintillator of claim 4, wherein the top reflector has a thickness between about greater than zero μm and 500 μm.

7. The scintillator of claim 4, wherein the top reflector is constructed of at least one of beryllium, aluminum, or amorphous carbon.

8. The scintillator of claim 1, wherein the scintillator is configured to receive incoming light comprising x-rays.

9. The scintillator of claim 8, wherein the semiconductor is capable of absorbing the incoming light and emitting light having a wavelength between 400 nm and 550 nm.

10. The scintillator of claim 1, wherein the semiconductor comprises at least one of a perovskite, CdSe, $Cs_3Cu_2I_5$, or PbS.

11. The scintillator of claim 10, wherein the perovskite comprises at least one of $FA_{1-x}Cs_xPbBr_3$ or $CsPbI_{3-y}Br_y$, $0 \leq x \leq 1$, and $0 \leq y \leq 3$.

12. The scintillator of claim 1, wherein each cavity has a depth between 50 μm and 5 mm.

13. The scintillator of claim 12, wherein the depth is between 250 μm and 1 mm.

14. The scintillator of claim 1, wherein the substrate comprises at least one of a glass, quartz, or sapphire.

15. A method of making a scintillator, the method comprising, in order:
   depositing a layer of a photoresist onto a substrate;
   depositing a mask onto the photoresist;
   developing the photoresist, resulting in the forming of a grid comprising a plurality of cavities, each cavity defined by at least three walls comprising the developed photoresist and the substrate; and depositing a semiconductor onto the grid, resulting in at least partially filling each cavity with the semiconductor.

16. The method of claim 15, further comprising depositing a top reflector onto the grid and the semiconductor.

17. The method of claim 16, further comprising depositing an encapsulating layer onto the top reflector.

18. The method of claim 15, wherein depositing the semiconductor is performed by a solution processing method.

19. The method of claim 15, wherein depositing the semiconductor comprises coating the grid with a solution comprising a perovskite precursor.

20. The method of claim 19, wherein:
the perovskite precursor is capable of forming a perovskite comprising at least one of $FA_{1-x}Cs_xPbBr_3$ or $CsPbI_{3-y}Br_y$,
$0 \leq x \leq 1$, and $0 \leq y \leq 3$.

* * * * *